United States Patent [19]

Lamensdorf et al.

[11] Patent Number: 4,698,633

[45] Date of Patent: Oct. 6, 1987

[54] ANTENNAS FOR WIDE BANDWIDTH SIGNALS

[75] Inventors: David Lamensdorf, Arlington; Kenneth W. Robbins, Wilmington; Gerald F. Ross, Lexington, all of Mass.

[73] Assignee: Sperry Corporation, New York, N.Y.

[21] Appl. No.: 380,805

[22] Filed: May 19, 1982

[51] Int. Cl.[4] ............................................. G01S 13/74
[52] U.S. Cl. .................................................... 342/42
[58] Field of Search .................. 343/13 R, 17.1 R; 307/281; 372/82; 342/42

[56] References Cited

U.S. PATENT DOCUMENTS

| | | | |
|---|---|---|---|
| 3,249,770 | 5/1966 | Hickey | 307/281 |
| 3,486,043 | 12/1969 | Johannessen | 307/281 |
| 3,539,809 | 11/1970 | Lokerson | 307/281 |
| 3,609,404 | 9/1971 | Uchida | 307/281 |
| 3,934,252 | 1/1976 | Ross et al. | 343/7 VM |
| 4,344,705 | 8/1982 | Kompa et al. | 343/13 R |

Primary Examiner—Theodore M. Blum
Attorney, Agent, or Firm—Howard P. Terry; Seymour Levine

[57] ABSTRACT

A system for transmitting and receiving very wide instantaneous bandwidth signals. Synchronized short pulse generators are positioned at the feed location of each element of a linear array of short capped monopole antennas to sequentially excite the antenna elements which are spaced in accordance with the sequential interval to provide a beam in the desired direction and space. Reflections of the radiated short pulses are received by a feed monopole backed by a reflecting monopole and coupled to a short pulse receiver through a duplexing switch.

27 Claims, 5 Drawing Figures

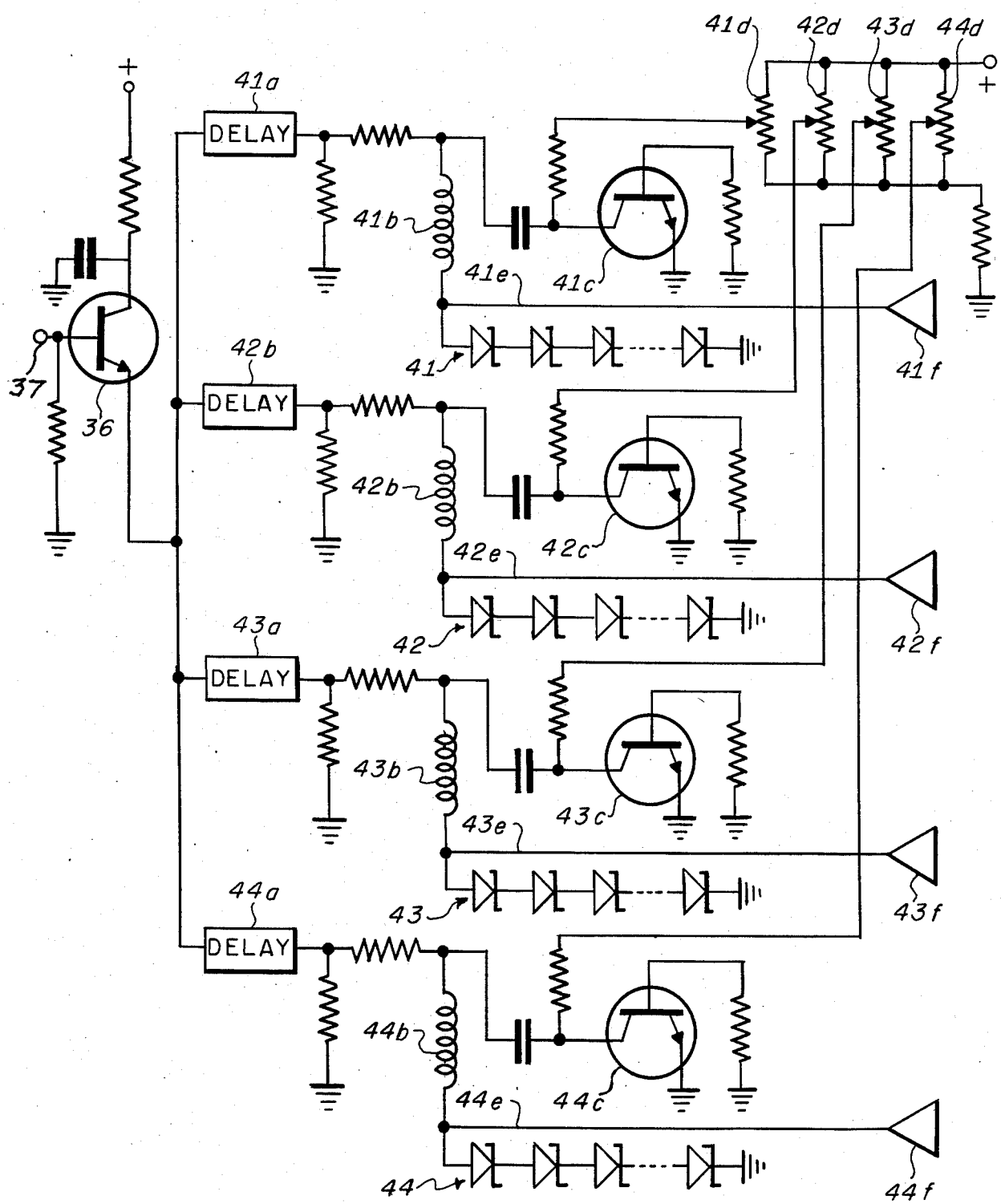
F I G. 3.

ANTENNAS FOR WIDE BANDWIDTH SIGNALS

BACKGROUND OF THE INVENTION

1. Field of the Invention

The invention pertains to the field of airborne antennas and more specifically to antennas mounted on a cylindrical metallic surface with limited extensions therefrom for radiating and receiving signals with very wide instantaneous bandwidths.

2. Description of the Prior Art

Constraints on antenna system design are determined by the instantaneous bandwidth of the radiated signal, the desired spatial distribution of that signal, the desired relation and reception efficiency, and dimensional limitations for a particular application. For cw or narrow band signals, design parameters to meet these objectives are generally well known. When the fractional bandwidth, however, becomes very wide (50% to 100%), only one or two cycles of the carrier exists within a radiation time interval and the narrow band approach to antenna design is no longer applicable. This wide signal bandwidth condition suggests quasi-optical or time delay techniques as effective antenna design procedures. Of the two techniques for designing antennas for wide bandwidth signals, the quasi-optical approach, wherein reflectors, lenses, and horns, though dispersive, are utilized to achieve the design objectives has found greater acceptance. In many applications, however, space constraints and the dispersive characteristics of the optical techniques establish the time delay technique as a more suitable approach.

The present invention utilizes time delay techniques to provide wide instantaneous bandwidth signal antennas mounted on a cylindrical metallic surface, such as the fuselage of a missile or small aircraft, that do not significantly extend above the surface.

SUMMARY OF THE INVENTION

A wide instantaneous bandwidth signal radiation and reception system embodying the principles of the present invention may include a linear array of capped monopoles positioned on the surface of a cylinder in a parallel relationship with the cylinders axis. Each element in the array is energized by one of a plurality of pulse generators whicha re sequentially triggered with intervening time intervals corresponding to the antenna element spacing, thus establishing a radiation pattern with a peak in the direction of the sequential order. Radar reflections are received by an antenna comprised of a capped monopole coupled via a switch to a receiver internal to the cylinder and a second capped monopole positioned as a reflecting element. Isolation between the receiving monopole and the transmitting monopole array is achieved by diametrically positioning the receiving and transmitting elements on the cylindrical surface, splitting the cylindrical surface in a plane perpendicular to an axis in line with the receiving and transmitting elements, placing a non-conducting material between the two cylindrical sections so formed to substantially reduce surface currents, and decoupling the receiver from the receiving antenna during transmissions by maintaining the switch therebetween in the open position during this interval.

The invention will be more clearly understood from the following description and from the accompanying drawings which illustrate as non-limitive examples of the preferred embodiments thereof.

BRIEF DESCRIPTION OF THE DRAWINGS

FIG. 3 is a schematic diagram of a sequential pulse generator useful for sequentially coupling energy to elements in the transmitting array.

DESCRIPTION OF THE PREFERRED EMBODIMENTS

Figure 1:
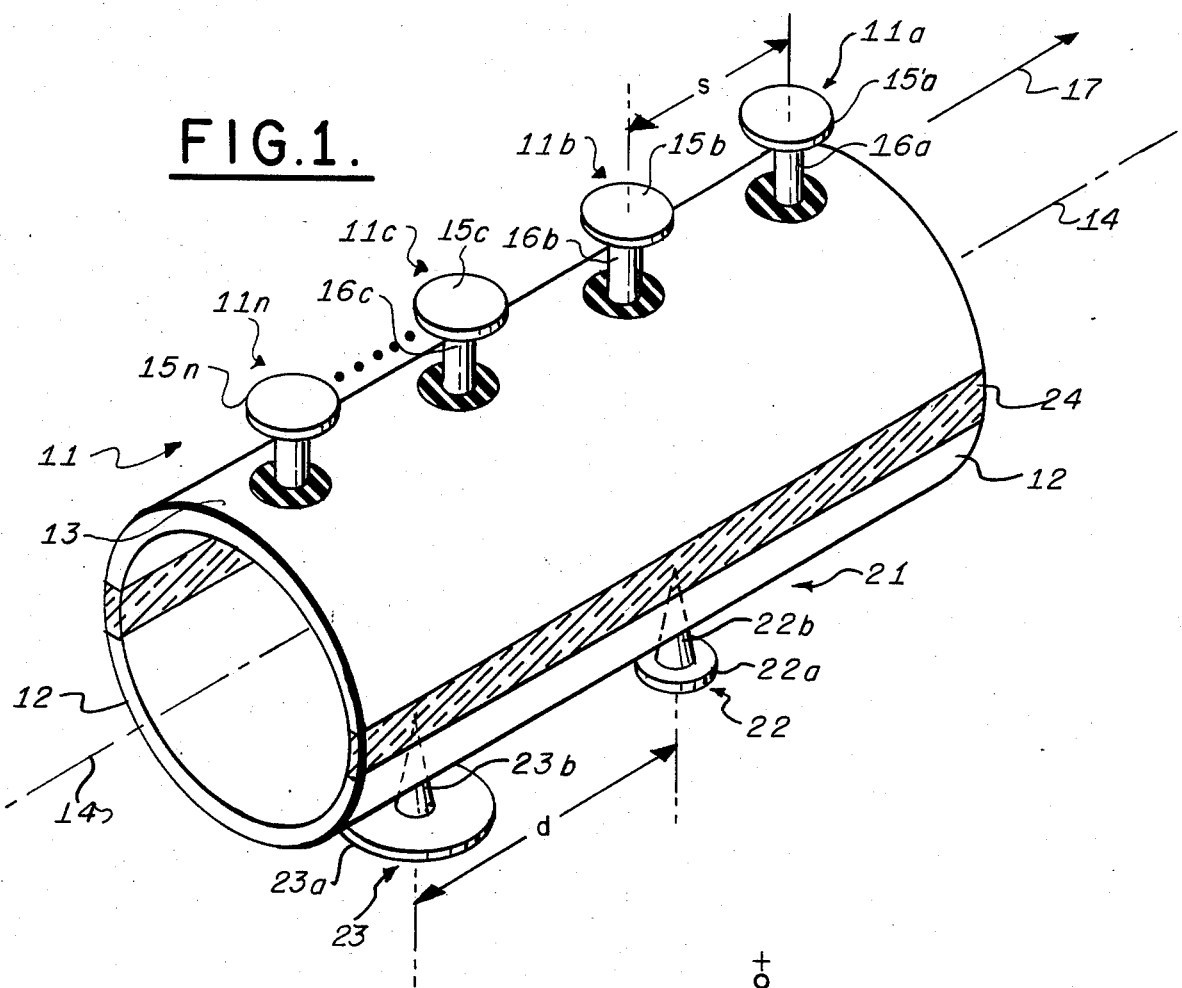
FIG. 1 is an illustration of transmitting and receiving antennas positioned on the surface of split cylinders having a non-conductive material positioned between the sections.

Antennas that may be employed with the system of the present invention are shown mounted on a cylindrical surface in FIG. 1. An array 11 of antenna elements 11a through 11n, each of which may be a capped monopole that protrudes radially from the surface of a cylinder 12 along a line 13 that is substantially parallel to the cylinder axis 14, may be employed as a transmitting antenna by sequentially exciting the elements 11a through 11n, as will be discussed subsequently. The caps 15a through 15n on each monopole 16a through 16n are of a diameter that is substantially equal to the height of the monopole, which may be for example less that $ct_r$, where $t_r$ is the rise time of the pulse to be radiated from the antenna element and c is the speed of light. Spacing s between the elements may be substantially equal to the distance travelled by a signal during the sequential interval between the excitation of adjacent elements. This arrangement forms a beam in the direction indicated by arrow 17 when the elements are excited in sequence from 11n to 11a.

A receiving antenna positioned on the cylinder 12 diametrically from the transmitting antenna 11 may comprise an active element 22 and a reflecting element 23, shorted to the cylindrical surface 12, each of which may be a conical monopole. The active and reflecting elements are shaped to minimize impedance mismatches to the feeding transmission line. Capped conical monopoles with half cone angles of 47°, shown in FIG. 1, at heights of approximately $\lambda_o/8$ and spacing d of substantially $\lambda_o/4$ ($\lambda_o$ being the wavelength at the center frequency in the band) provide a minimum mismatch to a 50 ohm transmission line when the cap diameter of the active element is substantially equal to the element height and the cap diameter of the reflecting element is substantially equal to twice the element height. The half cone angle of 47° is not critical and deviation therefrom may be practiced without significantly altering the match to the feed line.

It should be recognized by those skilled in the art that the capped monopole and capped conical monopoles are not limitative and that other antenna types, such as capped discones, may be employed. Additionally, it should be recognized that like elements may be employed for the transmitting array and receiving antenna. Capped monopoles and capped conical monopoles possess impedance characteristics that may be readily matched, respectively, to the impedances of the transmitter and receiver, each yet to be described, utilized in the preferred embodiment.

When each element in the transmitting antenna 11 is energized, the currents are induced on the cylindrical surface 12 that may coupled to the receiving antenna 21. These currents may be of sufficient amplitude to damage the receiver coupled to the active element 22 and limit the minimum operational range of the radar system. These currents may be significantly reduced by longitudinally cutting the cylindrical surface into two equal parts and replacing the sections thereby removed with electrical absorbing material 24. The significant decoupling between the transmitting and receiving antennas may be accomplished in this manner. Additional decoupling in many applications may be required. This may be accomplished by coupling a switch between the active element of the receiving antenna and the receiver as will be described subsequently.

Figure 2:
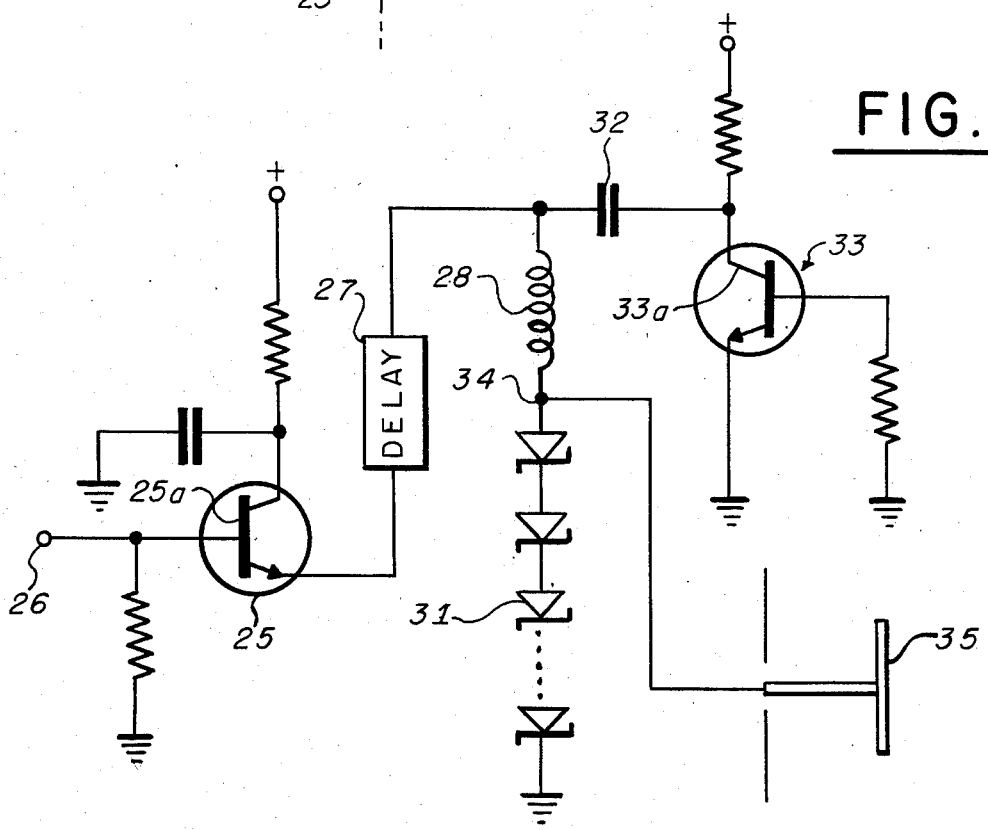
FIG. 2 is a schematic diagram of a pulse generator for use with an element in the transmitting array.

A pulse generator suitable for driving the capped monopole elements of the transmitting array is shown in FIG. 2. An avalanche transistor 25, which may be of the type known in the art as 2N2369, is triggered by an external pulse coupled to the base 25a via terminal 26 to provide a fast rising pulse of amplitude in the order of 30 volts and duration in the order of 4 ns. This pulse is coupled via an isolation delay line 27 and charging inductance 28 to charge a multiplicity of serially coupled diodes 31 of the step recovery type (stack of diodes). The pulse coupled through delay line 27 is also coupled via capacitor 32 to over voltage the collector 33a of transistor 33, which may be of the type known in the art as MPSU04, causing it to avalanche at a time predetermined by the bias voltages applied thereto. This produces a negative-going pulse of very high amplitude (in the order of 350 volts) which rapidly drains the stack of diodes 31 of the free charges stored therein by the charging pulse. When the free charges in the stack 31 are reduced to substantially zero, the voltage across the stack 31 "snaps" from a level of substantially zero to a level in the order of −200 volts over an interval of approximately 200 ps and returns to a level of substantially 0 volts in a comparable time, thereby establishing a pulse of substantially 400 ps duration at node 34, wherefrom it is coupled to a capped monopole 35.

An increase in radiated power, over that achievable with the circuit of FIG. 2, may be obtained by providing a linear array of elements sequentially fed, such that the pulses from each radiating element coalesce at the final excited element during its excitation interval to provide a radiated beam in a desired direction. Referring now to FIG. 3, an avalanche transistor 36 triggered by a pulse coupled to its base from an input terminal 37 substantially simultaneously charges diode stacks 41 through 44 via isolation delay lines 41a through 44a and charging inductors 41b through 44b, as previously described. Pulses from delay lines 41a through 44a are also coupled to over voltage the collectors of transistors 41c through 44c which thereafter avalanche in a sequence determined by the bias voltages established by the setting of potentiometers 41d through 44d and a positive voltage source not shown. Pulses sequentially generated by the diode stacks 41 through 44 are coupled via lines 41e through 44e to the array elements 41f through 44f, respectively.

Figure 4:
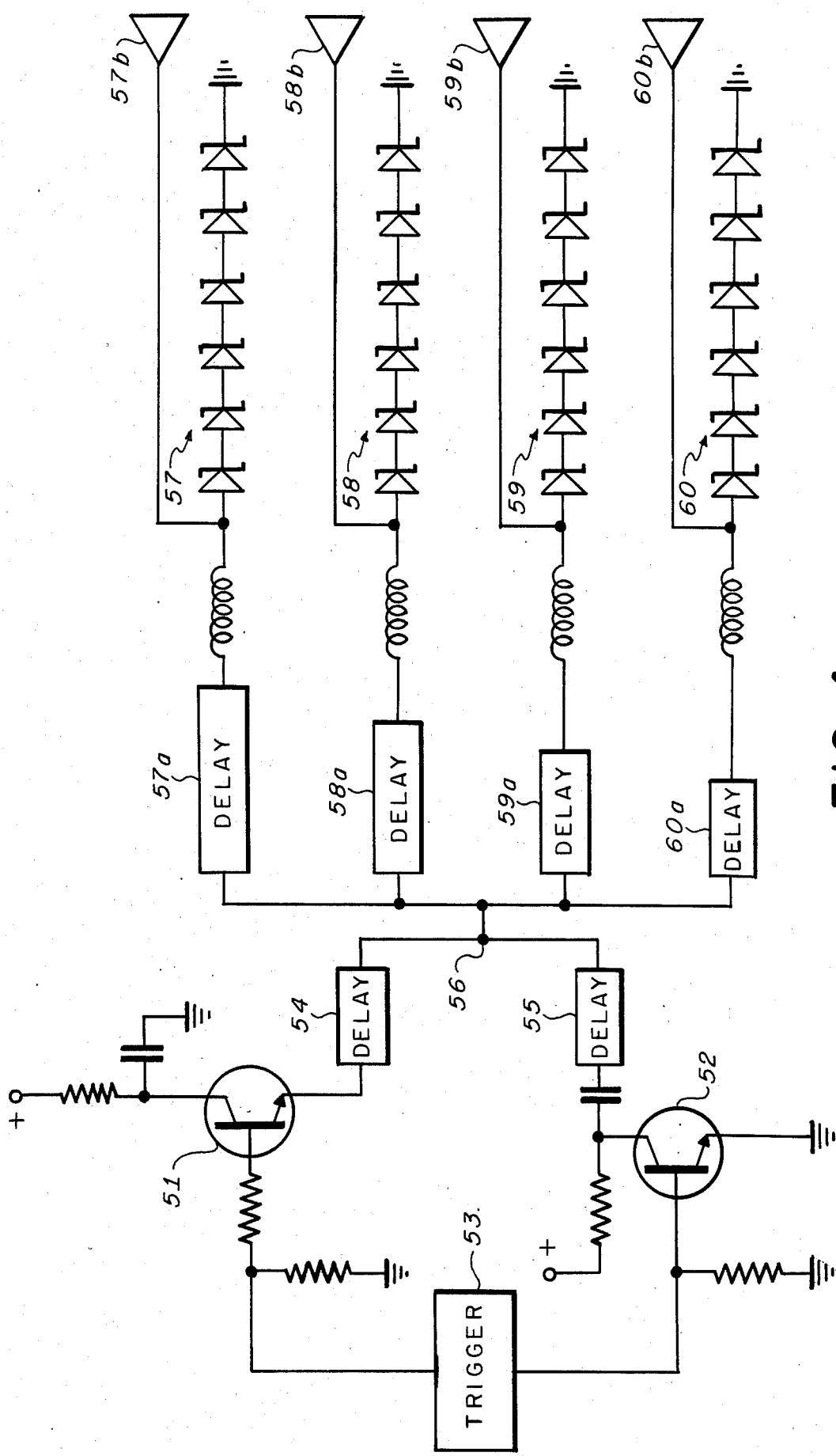
FIG. 4 is a schematic diagram of a sequential pulse generator wherein common diode charging and discharging elements are employed.

Avalanche transistors are temperature sensitive, thereby subjecting antenna characteristics that depend upon the sequential operation of a multiplicity of avalanche transistors to performance variations that are functions of temperature. This temperature sensitivity may be minimized by discharging the diode stack through a common avalanche transistor. Referring to FIG. 4, charging avalanche transistor 51 and discharging avalanche transistor 52 are triggered with a time interval therebetween by trigger generator 53 to couple charging and discharging pulses via delay lines 54 and 55, respectively, to node 56. The charging and discharging signals, with the time interval therebetween, are coupled via delay lines 57a, 58a, 59a, and 60a to diode stacks 57, 58, 59, and 60, respectively, in sequence, the sequential interval being determined by delay lines 57a–60a. Each of the diode stacks 57–60 charges and discharges in the manner previously described to sequentially excite antenna elements 57b, 58b, 59b, and 60b having spacing therebetween corresponding to the sequential interval. This circuit charges all the diode stacks through a single transistor and discharges all the diode stacks through another transistor, thus eliminating transistor temperature variations that may cause variations in the sequential interval and the width of the radiated pulses. It should be recognized that the single discharge transistor may be replaced with a stack of transistors when an amplitude is desired that cannot be achieved with the utilization of a single transistor.

Figure 5:
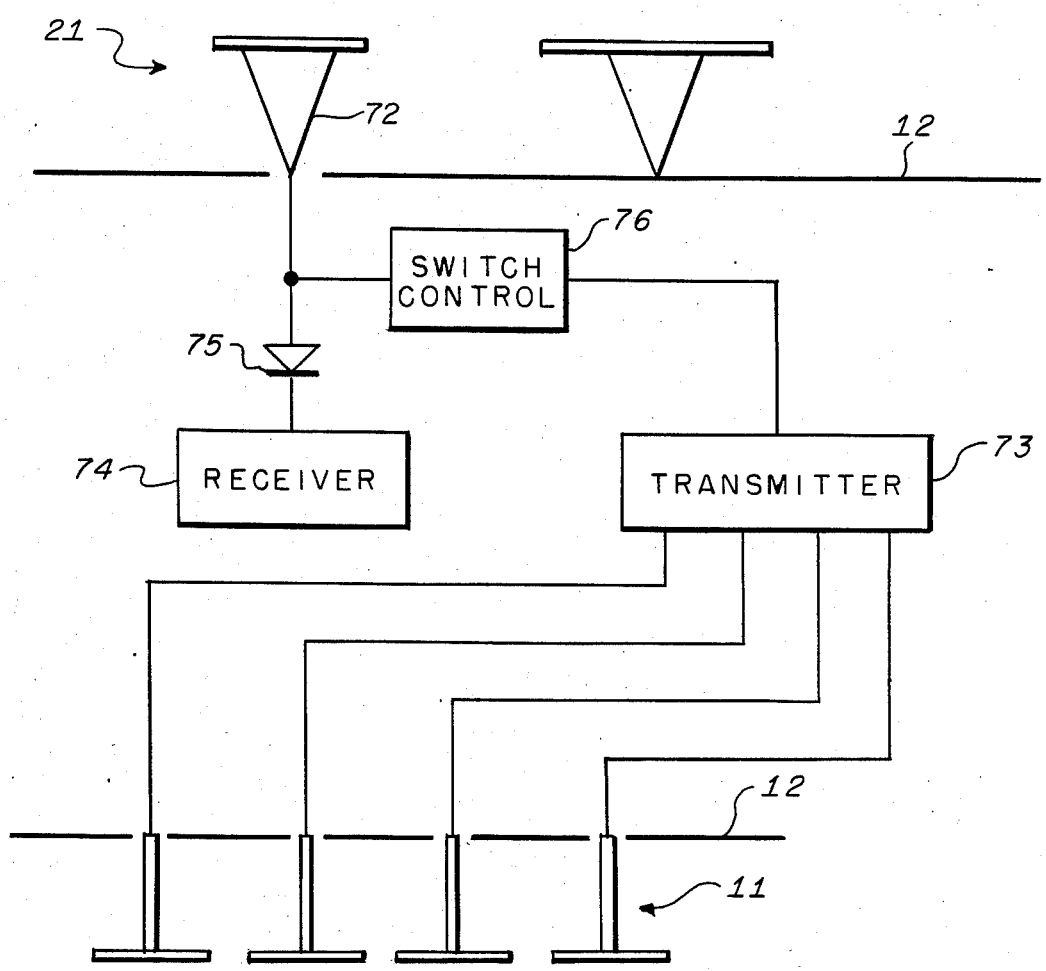
FIG. 5 is a block diagram, partially in schematic form, of the transmitting and receiving system.

Refer now to FIG. 5 wherein a block diagram of the equipment coupled to the transmitting array 11 and receiving antenna 21 of FIG. 1 is shown. The main limitation upon the minimum detectable range of the short pulse radar system is the direct coupled signal from the transmitter 73 to the receiver 74, which may be of the type disclosed in U.S. patent application Ser. No. 336,643, filed by Cronson et al. on Oct. 8, 1981 and assigned to the assignee of the present invention. A large amplitude signal, directly coupled from the transmitter to the receiver, may trigger the detector therein, even if it is biased off or the range gate is closed. As previously discussed, an absorber may be positioned between the two sections of the cylinder to reduce direct coupling due to surface currents. Further reduction of direct coupling may be obtained with a switch 75 positioned in the circuit between the receiving antenna 72 and the receiver 74. Switch 75 may be a SPST PIN diode controlled by a switch control generator 76. Trigger pulses may be coupled to the switch control generator 76 from transmitter 73 and may be the same pulses used to trigger the charging pulse generator 51.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A short pulse antenna system comprising:
   means for applying trigger pulses;
   charging means responsive to said trigger pulses for supplying charging pulses;
   pulse means charged in response to pulses coupled thereto from said charging means;
   means responsive to said charging means and coupled to said pulse means for providing discharge pulses to said pulse means at predetermined time intervals subsequent to said charging pulses to discharge said pulse means and establish a sequence of short pluses of predetermined duration, preselected rise time, and having said predetermined time intervals therebetween; and an array of antenna elements coupled to receive pulses from said pulse means in corresponding sequence for providing radiated pulses, said antenna elements having spacings therebetween equal distances traveled by light propagating in free space for a time equal to said predetermined time interval.

2. A short pulse antenna system in accordance with claim 1 wherein said charging means and said discharging means are avalanche transistors.

3. A short pulse antenna system in accordance with claims 1 or 2 wherein said pulse means includes a plurality of serially coupled step recovery diodes.

4. A short pulse antenna system in accordance with claim 1 wherein said array of antenna elements are capped monopoles having a monopole height less than a distance traveled by light propagating in free space for a time equal to said preselected rise time and a cap thereon of diameter equal to said monopole height.

5. A short pulse antenna system in accordance with claim 4 wherein said charging and discharging means comprise avalanche transistors.

6. A short pulse antenna system in accordance with claim 5 wherein said dischargeable charge storage devices include a plurality of serially coupled step recovery diodes.

7. A short pulse antenna system in accordance with claim 4 wherein
said pulse means includes a plurality of dischargeable charge storage devices, charged and discharged by said charging and discharging means to establish said short pulses.

8. A short pulse antenna system in accordance with claim 7 wherein said charging and discharging means comprise avalanche transistors.

9. A short pulse antenna system in accordance with claim 8 wherein said pulse means includes a plurality of serially coupled step recovery diodes.

10. A short pulse antenna system in accordance with claims 4, 5, 6, 7, 8, or 9, further including antenna means for receiving reflectins of said radiated pulses.

11. A short pulse antenna system in accordance with claim 10 wherein said receiving antenna means includes a feed antenna element and a reflector antenna element.

12. A short pulse antenna system in accordance with claim 11 wherein said feed and reflector antenna elements are discone antennas.

13. A short pulse antenna system in accordance with claim 11 wherein said feed and reflector antenna elements are capped monopoles.

14. A short pulse antenna system comprising:
means for supplying a trigger pulse;
charging means responsive to said trigger pulse for supplying a charging pulse:
discharging means responsive to said trigger pulse for supplying a discharging pulse at a predetermined time after said charging pulse; and
pulse means coupled to said charging means and said discharging means for providing a sequence of short pulses having preselected rise times in response to said charging and discharging pulses, said sequence having predetermined time intervals between pulses; and a plurality of antenna elements coupled to receive said short pulses in corresponding sequence for providing radiated pulses, said antenna elements having spacings therebetween equal to distances traveled by light propagating in free space for a time equal to said predetermined time intervals.

15. A short pulse antenna system in accordance with claim 14 wherein said pulse means includes:
a plurality of charge storage devices, each charged and discharged respectively by said charging and discharging means to establish a short pulse having a preselected rise time; and
a plurality of delay devices, providing time delays differing from one another, coupled to said charging means, said discharging means, and correspondingly coupled to said plurality of charge storage devices such that said charging and discharging pulses are coupled to said charge storage devices with time intervals therebetween to provide said sequence of short pulses.

16. A short pulse antenna system in accordance with claim 15 wherein said charging and discharging means comprise avalanche transistors.

17. A short pulse antenna system in accordance with claim 15 wherein each dischargeable charge storage device includes a plurality of serially coupled step recovery diodes.

18. A short pulse antenna system in accordance with claim 15 wherein said antenna elements are capped monopoles.

19. A short pulse antenna system in accordance with claims 14, 15, 16, 17, or 18 further including antenna means for receiving reflections of said radiated pulses.

20. A short pulse antenna system in accordance with claim 19 wherein said receiving antenna means includes a feed antenna element and a reflector antenna element.

21. A short pulse antenna system in accordance with claim 20 wherein said feed and refelector antenna elements are discone antennas.

22. A short pulse antenna system in accordance with claim 20 wherein said feed and reflector antenna elements are capped monopoles.

23. A short pulse antenna system in accordance with claim 20 further including:
means for receiving short pulse signals;
means coupled between said receiver means and said feed antenna element for coupling and decoupling said receiver means to said feed element in response to a switching signal applied thereto; and
control means coupled to said switch means for providing said switching signal in response to said trigger pulses.

24. A short pulse antenna system in accordance with claim 11 wherein said feed and reflector antenna elements are conical monopole antennas.

25. A short pulse antenna system in accordance with claim 11 wherein one of said feed and reflector antenna elements is a conical monopole and one of said feed and reflector antenna elements is a discone antenna.

26. A short pulse antenna system in accordance with claim 20 wherein said feed and reflector antenna elements are conical monopole antennas.

27. A short pulse antenna system in accordance with claim 20 wherein one of said feed and reflector antenna elements is a conical monopole and one of said feed and reflector antenna elements is a discone antenna.

* * * * *